(12) United States Patent
Cho

(10) Patent No.: US 7,816,917 B2
(45) Date of Patent: Oct. 19, 2010

(54) PERMEABILITY MEASUREMENT APPARATUS

(75) Inventor: Yasuo Cho, Sendai (JP)

(73) Assignee: Tohoku University, Sendai-shi (JP)

( * ) Notice: Subject to any disclaimer, the term of this patent is extended or adjusted under 35 U.S.C. 154(b) by 282 days.

(21) Appl. No.: 12/039,245

(22) Filed: Feb. 28, 2008

(65) Prior Publication Data

US 2008/0169805 A1 Jul. 17, 2008

Related U.S. Application Data

(63) Continuation of application No. PCT/JP2006/316867, filed on Aug. 28, 2006.

(30) Foreign Application Priority Data

Sep. 2, 2005 (JP) ............................. 2005-254371

(51) Int. Cl.
*G01V 3/00* (2006.01)
(52) U.S. Cl. ...................... 324/316; 324/319
(58) Field of Classification Search ......... 324/300–322; 600/407–445
See application file for complete search history.

(56) References Cited

U.S. PATENT DOCUMENTS

| 5,760,688 | A | 6/1998 | Kasai |
| 6,107,924 | A | 8/2000 | Kasai et al. |
| 6,631,647 | B2 * | 10/2003 | Seale ........................... 73/789 |
| 7,001,785 | B1 * | 2/2006 | Chen ............................ 438/10 |
| 7,084,632 | B2 * | 8/2006 | Xiao et al. .................. 324/319 |
| 7,541,811 | B2 * | 6/2009 | Usagawa .................... 324/319 |
| 2002/0154918 | A1 | 10/2002 | Sawayama |

FOREIGN PATENT DOCUMENTS

| JP | A 5-40100 | 2/1993 |
| JP | A 8-75806 | 3/1996 |
| JP | A 9-43007 | 2/1997 |
| JP | A 10-48185 | 2/1998 |
| JP | A 2002-296240 | 10/2002 |
| JP | A 2002-333467 | 11/2002 |
| JP | A 2003-57323 | 2/2003 |
| JP | A 2003-121419 | 4/2003 |

OTHER PUBLICATIONS

Makoto Endo, et al., "Scanning Nonlinear Magnetic Microscopy," Extended Abstracts (The 66th Autumn Meeting, 2005); The Japanese Society of Applied Physics, No. 2, pp. 559, Sep. 5, 2005.

* cited by examiner

*Primary Examiner*—Brij B Shrivastav
(74) *Attorney, Agent, or Firm*—Greer, Burns & Crain, Ltd.

(57) ABSTRACT

A permeability measurement apparatus includes a magnetic field generation means applying an alternating magnetic field having a predetermined frequency to a magnetic substance to be measured; a probe needle placed in proximity or in contact to a microscopic area of the magnetic substance to be measured to which the alternating magnetic field is applied; a resonator including a coil wound on the probe needle, and generating a magnetic field having a resonant frequency higher than the frequency of the alternating magnetic field applied on the microscopic area having the probe needle in proximity or in contact thereto, and having an inductance of the coil varied as permeability in the microscopic area varies; and a measurement means measuring the permeability of the microscopic area of the magnetic substance to be measured based on the variation of the resonant frequency of the resonator according to the variation of the coil inductance.

10 Claims, 13 Drawing Sheets

FIG. 5(a)
Periodically Polarization-reversed Magnet
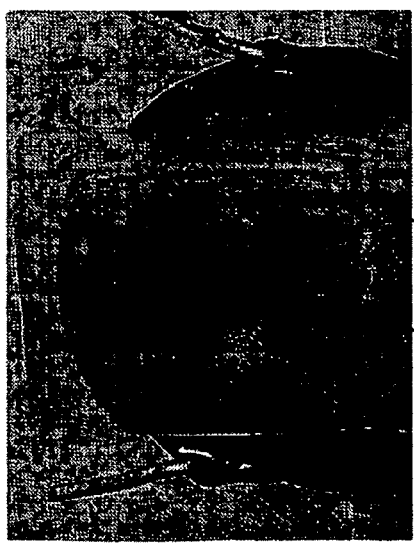
Approximately 5 mm
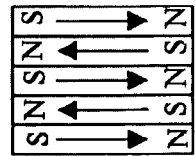
Figure Looked From the Side
FIG. 5(b)
Approximately 1 mm pitch    100 μm step

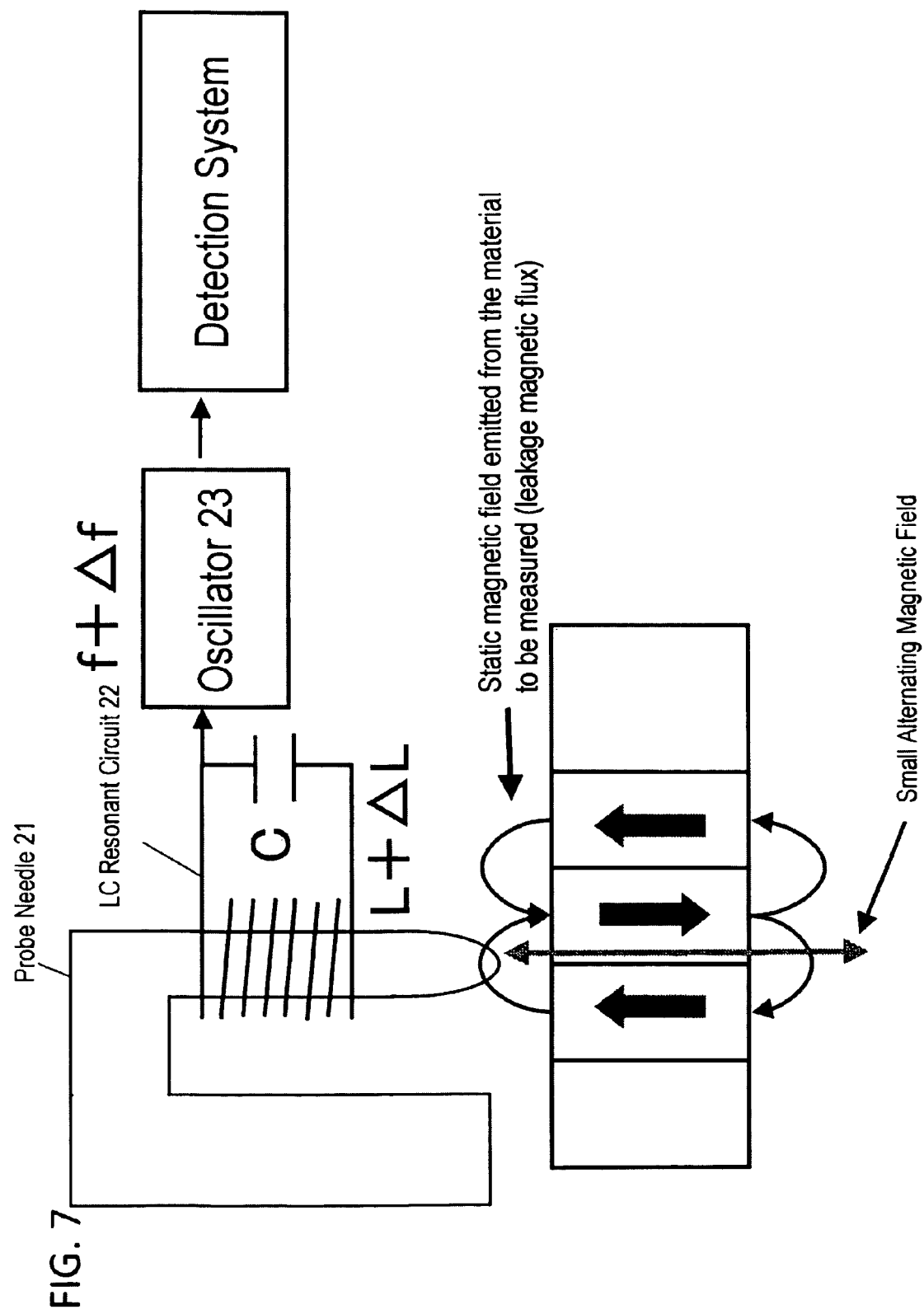

PERMEABILITY MEASUREMENT APPARATUS

CROSS REFERENCE TO RELATED APPLICATIONS

This application is a continuation of International Application No. PCT/JP2006/316867, filed on Aug. 28, 2006, now pending, herein incorporated by reference. Further, this application is based upon and claims the benefit of priority from the prior Japanese Patent Application No. 2005-254371, filed on Sep. 2, 2005, the entire contents of which are incorporated herein by reference.

FIELD OF THE INVENTION

The present invention relates to a permeability measurement apparatus for measuring permeability of a magnetic substance, and more particularly, a permeability measurement apparatus for measuring permeability of a microscopic area, a portion of a magnetic substance, and capable of measuring nonlinear permeability of the magnetic substance.

BACKGROUND ARTS

Permeability $\mu$ of a magnetic substance can be obtained by obtaining a magnetic field H and a magnetic flux density B of the magnetic substance and by using a known relational equation $B=\mu H$ in the electromagnetic theory. As a measurement method in principle, for example, a material to be measured is formed into a toroidal core, and the magnetic field H is obtained from a current flowing in a coil wound on the core, and the magnetic flux density B is obtained from a voltage which is detected as a result of the variation of the magnetic flux. Thus, it is possible to obtain the permeability $\mu$ of the material to be measured.

For example, in Patent document 1 shown below, there is disclosed a configuration in a permeability measurement method using the above-mentioned principle, to measure the permeability simply without forming the material to be measured into a toroidal shape. Specifically, as disclosed in FIG. 5, the permeability of the material to be measured is measured by: forming a magnetic path to form a magnetic potential at a gap portion of a reference coil; generating magnetic flux on the magnetic path; detecting the magnetic flux in the magnetic path by a pickup coil; mounting the material to be measured on the gap portion of the magnetic path formed with magnetic flux generated by the reference coil; and detecting a variation of the magnetic flux of the pickup coil depending on the presence or absence of the material to be measured at the gap portion.

Also, in Patent document 2 shown below, there is disclosed a method for obtaining the permeability of a material to be measured by disposing the material to be measured in the vicinity of a coil of an LC resonant circuit in a non-contact manner, and extracting a variation of a resonant frequency as a phase difference, by using that the inductance of a coil is varied depending on the permeability of the material to be measured, so as to obtain the permeability of the material to be measured.

Further, in Patent document 3 shown below, there is disclosed an invention, which was devised by the inventors of the present invention, in regard to an apparatus for measuring a nonlinear dielectric constant in a microscopic area of a dielectric, a material to be measured, through the variation of the capacity of a capacitor in a resonator. However, the above apparatus is not aimed to measure the permeability of a magnetic substance.

Patent document 1: The official gazette of the Japanese Unexamined Patent Publication No. 2003-121419.
Patent document 2: The official gazette of the Japanese Unexamined Patent Publication No. 2002-296240.
Patent document 3: The official gazette of the Japanese Unexamined Patent Publication No. Hei-8-75806.

DISCLOSURE OF THE INVENTION

Problems to be Solved by the Invention

However, as represented by the aforementioned patent documents and the like, the conventional permeability measurement is to obtain an overall permeability of the material to be measured. When the material to be measured has not a uniform permeability distribution, it is only possible to measure a mean value of the permeability of the material to be measured, and it is not possible to measure accurate permeability on the basis of each microscopic area having different permeability.

Also, a direction of magnetic polarization of the material to be measured cannot be obtained from the primary (linear) permeability obtained by the conventional permeability measurement, and it is required to measure nonlinear permeability on the basis of each microscopic area of the material to be measured. However, there has not been proposed a method for measuring nonlinear permeability of a magnetic substance on the basis of each microscopic area thereof.

Accordingly, it is an object of the present invention to provide a permeability measurement apparatus capable of measuring permeability and nonlinear permeability of the magnetic substance on the bases of each microscopic area.

MEANS TO SOLVE THE PROBLEMS

As a first configuration of a permeability measurement apparatus according to the present invention to achieve the aforementioned object, the permeability measurement apparatus includes: a magnetic field generation means applying an alternating magnetic field having a predetermined frequency to a magnetic substance to be measured; a probe needle placed in proximity or in contact to a microscopic area of the magnetic substance to be measured to which the alternating magnetic field is applied; a resonator including a coil wound on the probe needle, and generating a magnetic field having a resonant frequency higher than the frequency of the alternating magnetic field applied on the microscopic area having the probe needle in proximity or in contact thereto, and having an inductance of the coil varied as permeability in the microscopic area varies; and a measurement means measuring the permeability of the microscopic area of the magnetic substance to be measured based on the variation of the resonant frequency of the resonator according to the variation of the coil inductance.

As a second configuration of the permeability measurement apparatus according to the present invention, in the above first configuration, the measurement means includes: an oscillation means outputting an oscillation signal having a frequency according to the variation of the resonant frequency; a demodulation means outputting a voltage signal demodulated from the oscillation signal; and a detection means detecting linear permeability from a direct current component of the voltage signal.

As a third configuration of the permeability measurement apparatus according to the present invention, in the above first configuration, the measurement means includes: an oscillation means outputting an oscillation signal having a frequency according to the variation of the resonant frequency; a demodulation means outputting a voltage signal demodulated from the oscillation signal; and a detection means detecting nonlinear permeability from an alternating current component of the voltage signal.

As a fourth configuration of the permeability measurement apparatus according to the present invention, in the above third configuration, the detection means measures lowest-order nonlinear permeability from a predetermined frequency component of the alternating magnetic field among the alternating current component of the voltage signal, and also measures higher-order nonlinear permeability than the lowest order based on a frequency component of integer multiple of two or more of the predetermined frequency of the alternating magnetic field.

As a fifth configuration of the permeability measurement apparatus according to the present invention, in the above fourth configuration, the detection means measures a direction of magnetization in the microscopic area, based on a sign of nonlinear permeability in an odd-rank tensor including the lowest-order nonlinear permeability.

As a sixth configuration of the permeability measurement apparatus according to the present invention, in the above fourth configuration, the permeability measurement apparatus further includes: a scanning means moving the probe needle relatively to the magnetic substance to be measured; and a gap control means performing non-contact control so that a gap between the probe needle and the material to be measured becomes a certain distance based on a measurement level of the high-order nonlinear permeability detected by the detection means. Further, the detection means measures nonlinear permeability of lower order than the high-order nonlinear permeability.

As a seventh configuration of the permeability measurement apparatus according to the present invention, in the above fourth configuration, the magnetic field generation means applies a rotating magnetic field having a magnetic field direction successively rotating in a predetermined plane.

As an eighth configuration of the permeability measurement apparatus according to the present invention, in the above first configuration, the probe needle includes an extension portion being connected to the probe needle and extending substantially in parallel to the probe needle to a position in the proximity of the magnetic substance to be measured.

As a ninth configuration of the permeability measurement apparatus according to the present invention, in the above fourth configuration, the detection means further measures a magnitude and a direction of the magnetic field in the microscopic area of the magnetic substance to be measured, based on the measured nonlinear permeability.

As a tenth configuration according to the present invention, an electron spin resonance apparatus includes: a magnetic field generation means applying an alternating magnetic field having a predetermined frequency and a direct-current magnetic field in superposition to a magnetic substance to be measured; a probe needle placed in proximity or in contact to a microscopic area of the magnetic substance to be measured; a resonator including a coil wound on the probe needle, and generating a magnetic field having a predetermined resonant frequency applied on the microscopic area having the probe needle in proximity or in contact thereto, and at least having inductance of the coil varied due to electron spin resonance generated in the microscopic area; and a measurement means for measuring electron spin resonance generated in the microscopic area of the magnetic substance to be measured based on the variation of the resonant frequency or the resonant level of the resonator.

EFFECTS OF THE INVENTION

According to the first configuration of the present invention, it is possible to measure a variation of permeability in a microscopic area of a magnetic substance with high sensitivity. According to the second configuration of the present invention, it is possible to measure a variation of linear permeability in a microscopic area of a magnetic substance. According to the third configuration of the present invention, it is possible to measure a variation of nonlinear permeability in a microscopic area of a magnetic substance with high sensitivity. According to the fourth configuration of the present invention, it is possible to measure nonlinear permeability from the lowest order to higher order. According to the fifth configuration of the present invention, it is possible to measure a direction of magnetization (direction of magnetic polarization) in a microscopic area. According to the sixth configuration of the present invention, it is possible to measure permeability in a non-contact manner by controlling to maintain a gap between a material to be measured and a probe needle so that necessary sensitivity for measuring the permeability can be secured. According to the seventh configuration of the present invention, it is possible to measure magnetic polarization in the entire directions either two dimensionally or three dimensionally by applying a rotating magnetic field. According to the eighth configuration of the present invention, it is possible to measure permeability with high sensitivity by suppressing leakage magnetic flux in a magnetic circuit. According to the ninth configuration of the present invention, it is possible to measure a magnetic field of a magnetic substance. According to the tenth configuration of the present invention, it is possible to measure electron spin resonance of a magnetic substance.

BRIEF DESCRIPTION OF THE DRAWINGS

FIG. 5 shows a diagram illustrating an embodiment of measuring a magnetic domain.

FIG. 7 shows a diagram illustrating an exemplary configuration for measuring a magnetic field distribution of a permeability measurement apparatus according to the present embodiment.

DESCRIPTION OF REFERENCE SYMBOLS

Figure 1:
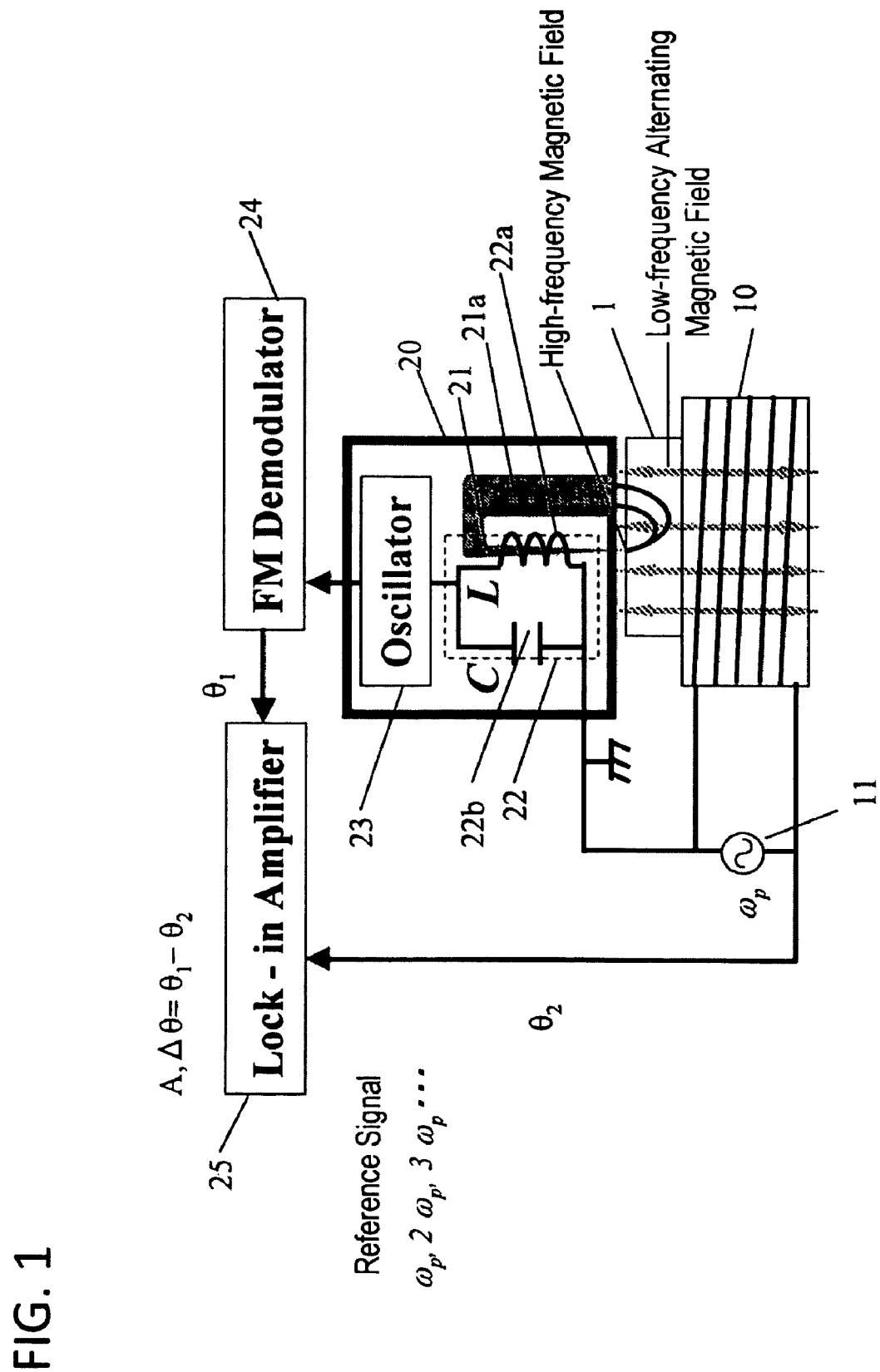
FIG. 1 shows a diagram illustrating an exemplary configuration of a permeability measurement apparatus according to an embodiment of the present invention.

1: material to be measured (magnetic substance), 10: magnetic field generator, 11: alternating-current power supply, 20: probe, 21: probe needle, 22: LC resonant circuit, 22a: coil, 22b: capacitor, 23: oscillator, 24: demodulation circuit, 25: synchronous detector, 29: distributed-constant resonator, 31: magnet for applying direct-current magnetic field, 32: low-frequency magnetic field modulation coil.

BEST MODE FOR IMPLEMENTING THE INVENTION

The embodiments of the present invention are described hereinafter referring to the drawings. However, the embodiments described below are not intended to limit the technical scope of the present invention.

FIG. 1 shows a diagram illustrating an exemplary configuration of a permeability measurement apparatus according to an embodiment of the present invention. Here, the configuration shown in FIG. 1 is a configuration for measuring nonlinear permeability of a material to be measured. In FIG. 1, a magnetic field generator 10 includes a coil connected to an alternating-current power supply 11 with angular frequency $\omega p$, and is disposed right below a material 1, which is a magnetic substance, to be measured. By making an alternating current flow through the coil, an alternating magnetic field, having a large amplitude and low angular frequency $\omega p$ (10 kHz, for example) is applied to the material 1 to be measured.

Magnetic field generator 10 has a substantially horizontal plane, and material 1 to be measured is mounted on the plane. The upper face of material 1 to be measured is substantially parallel to the lower face, and further, on the upper face of material 1 to be measured, a probe 20 is disposed in a scannable manner.

Probe 20 includes a probe needle 21 formed of either a para magnetic substance having high linear permeability or another magnetic substance resembling the para magnetic substance, a coil 22a, an externally attached capacitor 22b and an oscillator 23.

A sharp tip portion of probe needle 21 contacts to the upper face of material 1 to be measured, and preferably, probe needle 21 is formed in a U-shape and includes an extension portion 21a which is connected to probe needle 21 and extends substantially in parallel with probe needle 21, to the proximity of material 1 to be measured. With this, probe needle 21 forms a magnetic circuit in an integrated manner with material 1 to be measured. As described later, a variation in a magnetic resistance of the magnetic circuit is most intensively affected by a variation of permeability in the vicinity of the surface of material 1 to be measured which contacts to the sharp-pointed tip portion of probe needle 21.

An LC resonant circuit 22 is configured of coil 22a wound on probe needle 21 and capacitor 22b connected in parallel to the above coil 22a. A small high-frequency magnetic field caused by the resonant frequency is applied in concentration to a microscopic area of material 1 to be measured being disposed right below probe needle 21. A resonant frequency $f_{LC}$ (angular frequency $\omega_{LC}=2\pi f_{LC}$) of LC resonant circuit 22 has a far greater frequency (for example, on the order of 1 GHz) than the angular frequency $\omega p$ of the alternating magnetic field generated by magnetic field generator 10.

When the magnetic resistance of the magnetic circuit varies, an inductance L of coil 22a is varied, and the resonant frequency of LC resonant circuit 22 is varied. Namely, the magnetic resistance of the magnetic circuit is varied by the variation of permeability in a microscopic area of material 1 to be measured to which the tip portion of probe needle 21 contacts, and therefore, the resonant frequency of the LC resonant circuit 22 is varied depending on the variation of permeability in the microscopic area of the material to be measured.

Accordingly, while the alternating magnetic field applied by magnetic field generator 10 varies with a relatively low frequency $\omega p$, the variation of permeability in a microscopic area of material 1 to be measured, disposed right below probe needle 21, is detectible as a variation of a high-frequency resonant frequency.

Oscillator 23 is a self-excited oscillator, having a configuration that LC resonant circuit 22 is inserted in the positive feedback portion of the above oscillator. Accordingly, by oscillating in tune with the resonant frequency of LC resonant circuit 22, oscillator 23 outputs a frequency modulated (FM) oscillation signal according to the variation of the resonant frequency.

An FM demodulation circuit 24 demodulates the frequency-modulated oscillation signal, so as to convert into a voltage signal, and outputs the voltage signal thereof to a lock-in amplifier 25.

To lock-in amplifier 25, as a reference signal, a frequency signal of n times (n is a natural number) as large as the frequency $\omega p$ of the alternating-current power supply is input as a reference signal, and through synchronous detection with the voltage signal from FM demodulation circuit 24, a frequency component identical to the reference signal frequency is extracted from the alternating current component of the voltage signal. The output level (amplitude A) of lock-in amplifier 25 represents a frequency variation of the oscillation signal caused by the variation of nonlinear permeability of material 1 to be measured. From the above output signal, it is possible to measure the nonlinear permeability of material 1 to be measured. Further, the output signal of lock-in amplifier 25 also includes a difference ($\Delta\theta$) between a phase (angle $\theta 1$) of the voltage signal and a phase (angle $\theta 2$) of the reference signal.

Then, as the frequency of the reference signal, when setting the frequency $\omega p$ of alternating-current power supply 11, lowest-order nonlinear permeability can be measured. Also, by setting a frequency $2\omega p$, twice as large frequency as alternating-current power supply 11, nonlinear permeability of higher order by one can be measured, and by setting a frequency $3\omega p$, three times as large frequency as alternating-current power supply 11, nonlinear permeability of higher order by two can be measured. In a similar manner, as the frequency of the reference signal, by setting n-times (n is a natural number) as large as the frequency $\omega p$ of the alternating-current power supply, permeability of successively higher order can be measured. Here, in the present specification, primary permeability is referred to as linear permeability, and secondary permeability or more is referred to as nonlinear permeability, and the lowest order of nonlinearity is the secondary.

Now, description of the linear permeability and the nonlinear permeability will be given in the following. When nonlinearity of the permeability is taken into consideration, the relationship between B (magnetic flux density) of a magnetic material and H (magnetic field) can be expressed as:

$$B_i = \mu_0(H_i + M_i) = \mu_0 Mr_i + \mu_{ij}H_j + (1/2!)\mu'_{ijk}H_jH_k + (1/3!)\mu''_{ijkl}H_jH_kH_l + (1/4!)\mu'''_{ijklm}H_jH_kH_lH_m + A$$ Equation (1)

Here, $B_i$, $H_i$ and $M_i$ represent the i-components (i=1-3) of the magnetic flux density, the magnetic field and the magnetization vector, respectively, and Mr represents residual magnetization. Also, the above equation (1) conforms to Einstein's convention, in which addition of 1-3 is performed when an identical suffix appears.

Each expansion coefficient $\mu_{ij}$, $\mu'_{ijk}$, $\mu''_{ijkl}$ and $\mu'''_{ijklm}$ ... in equation (1) is a tensor magnitude of second rank, third rank, fourth rank and fifth rank, ..., which is referred to as permeability of primary (linear), secondary, third order, fourth order, .... In some cases, linear permeability is called as secondary permeability, and the lowest order of nonlinear permeability is called as third order so that the order coincides with the rank number of the tensor magnitude. However, in the present specification, it is to be noted that each rank number of the tensor magnitude is different by one from each order of the permeability.

For example, to a material to which the B-H relationship is given by the above-mentioned equation (1), when an alternating magnetic field $H_{p3} = H_p \cos \omega_p t$, having a sufficiently low frequency as compared with the oscillation frequency and a relatively large amplitude, is externally applied to three directions, by differentiating the above equation (1), a linear (differential) permeability variation sensed by a small high-frequency magnetic field having the above frequency $f_{LC}$ can be expressed as follows:

$$\mu_{33}(H_3) = \mu_{33} + \mu'_{333}H_{p3} + (1/2)\mu''_{3333}H_{p3}^2 + (1/6)\mu'''_{33333}H_{p3}^3 + A \approx \mu_{33} + \mu'_{333}H_p \cos \omega_p t + (1/4)\mu''_{3333}H_p^2 \cos 2\omega_p t + (1/24)\mu'''_{33333}H_p^3 \cos 3\omega_p t + A$$ Equation (2)

Thus, it can be understood that the lowest-order permeability $\mu'$ (i.e. secondary permeability) is included in the term varying with the same frequency component ωp as the applied alternating magnetic field, and the permeability $\mu''$ of higher order by one (i.e. third order) is included in the term of 2ωp, and further, the permeability of still higher order (fourth order) is included in a term of 3ωp. Namely, an alternating variation of the linear permeability produced in relation to the secondary permeability varies with the same frequency ωp as the applied alternating magnetic field, and the amplitude thereof is in proportion to the amplitude of the applied magnetic field. Also, the alternating variation related to the third-order permeability varies with twice as large frequency, 2ωp, as the frequency of the applied alternating magnetic field, and the amplitude thereof is in proportion to the square of the amplitude of the applied magnetic field.

Accordingly, by setting the reference signal frequency being input to lock-in amplifier 25 to be a frequency corresponding to the permeability of which order is to be measured, permeability of desired order can be measured in separation.

Additionally, the lowest-order nonlinear permeability (secondary permeability) $\mu'_{ijk}$, namely, the third-rank tensor magnitude in equation (1), does not exist in an isotropic substance, but exists only in an anisotropic substance. In the case of a ferromagnetic substance, the sign of the secondary permeability is reversed according to the reverse of the direction of magnetic polarization (N pole and S pole). Therefore, the direction of magnetization can be obtained by detecting the sign of the secondary permeability.

Figure 2:
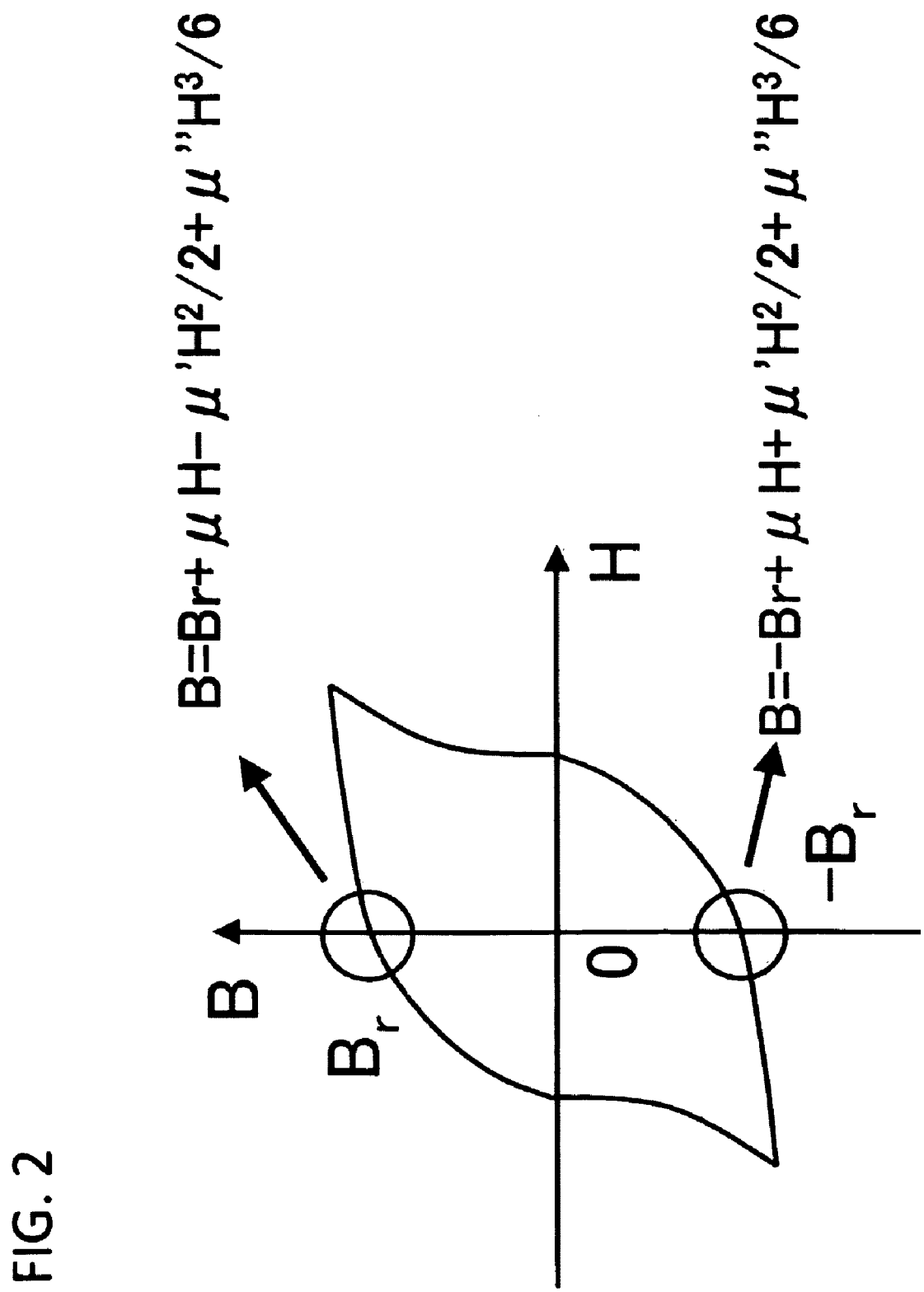
FIG. 2 shows a diagram illustrating the relationship between the hysteresis curve and the nonlinear permeability of a ferromagnetic substance.

FIG. 2 shows a diagram illustrating the relationship between the hysteresis curve and the nonlinear permeability of a ferromagnetic substance. In FIG. 2, a phenomenon in the Z direction is considered for simplification. At the point of B=Br, because the hysteresis curve is convex upward, the sign of secondary nonlinear permeability $\mu'_{333}$, which is the coefficient of a quadratic curve component of the hysteresis curve, becomes negative. On the other hand, at the point of B=−Br, because the hysteresis curve is convex downward, the sign of secondary nonlinear permeability $\mu'_{333}$ becomes positive.

Additionally, not only the secondary permeability, the direction of magnetization can be discriminated from each sign in case of nonlinear permeability of an even power such as a forth order and a sixth order (i.e. nonlinear permeability in an odd-rank tensor). As to the case of nonlinear permeability of odd powers (i.e. nonlinear permeability in an even-rank tensor), the sign thereof is not reversed even when the magnetization polarization is reversed. Also, not only limited to the secondary permeability, an isotropic substance has not any terms of even power in the aforementioned equation (1).

Next, description is given on a variation of the permeability μ and a variation of the inductance L. As described earlier, in regard to the magnetic circuit formed of probe needle 21 and material 1 to be measured, a variation of the magnetic resistance thereof is affected most intensively by the variation of permeability in a microscopic area in the vicinity of the surface of material 1 to be measured, disposed right below probe needle 21. Hereafter, referring to FIG. 3, there is shown the relationship between the inductance L of coil 22a and the permeability of material 1 to be measured in the vicinity of the surface, disposed right below probe needle 21.

Figure 3:
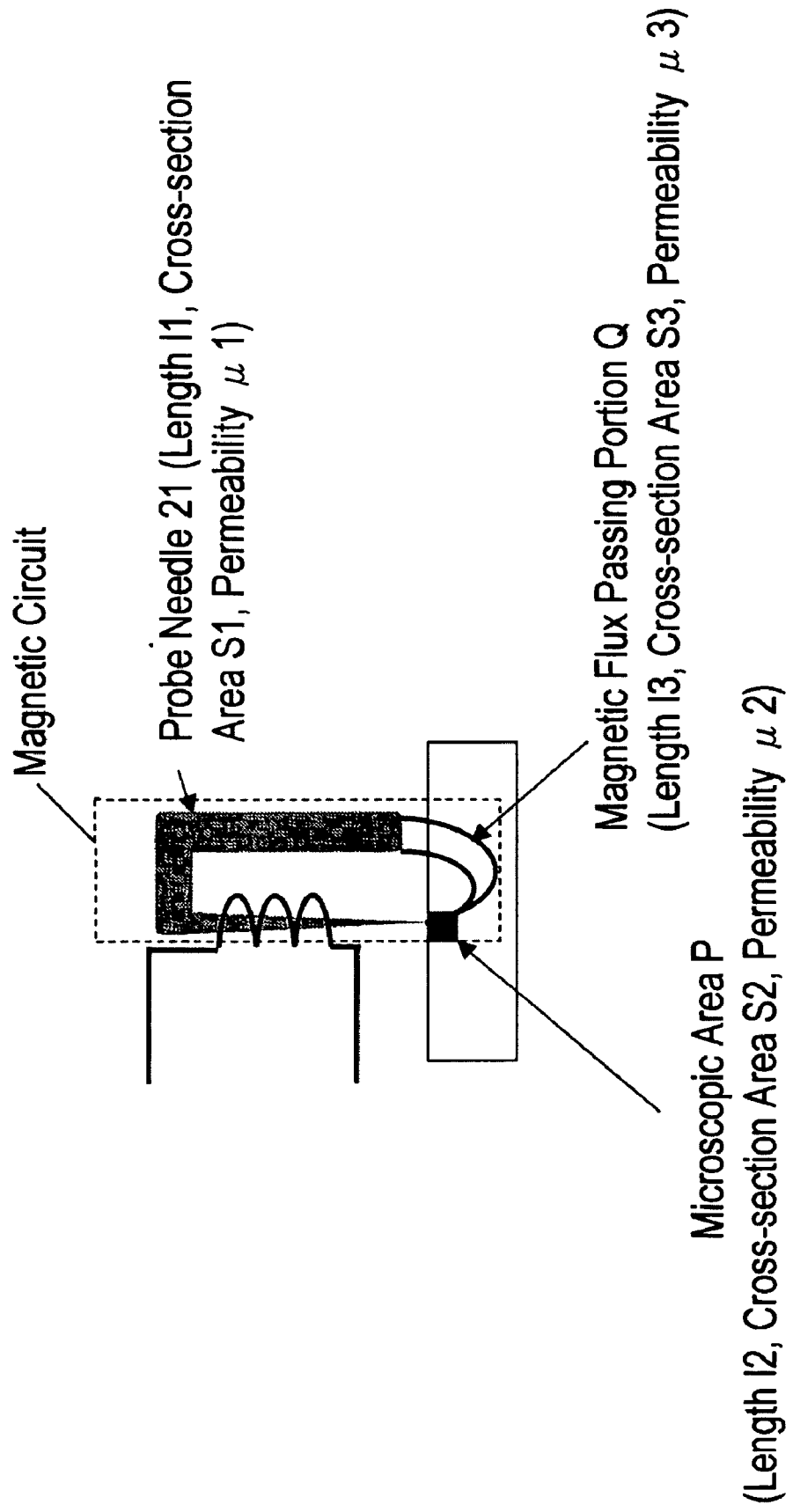
FIG. 3 shows a diagram illustrating a magnetic circuit model.

FIG. 3 shows a diagram illustrating a magnetic circuit model. The model shown in FIG. 3 is merely an approximate model which is different in a strict sense from an actual configuration, for the simplification of calculation. As shown in FIG. 3, the magnetic circuit is sectioned into probe needle 21, a microscopic area P of material 1 to be measured, having large magnetic resistance due to a concentrated high-frequency magnetic field right below probe needle 21, and a magnetic flux passing portion Q in material 1 to be measured, having sufficiently small magnetic resistance as compared with the above portion P due to a greatly expanded magnetic flux of the high-frequency magnetic field in the material to be measured. Also, the length of probe needle 21 is l1, the cross-section area is S1 (although an actual shape becomes thinner toward the tip end, it is treated to have a uniform cross-section area here), and the permeability is μ1. Further, as to the microscopic area P right below probe needle 21, the length (depth) thereof is l2, the cross-section area is S2, and the permeability is μ2. Further, as to the magnetic flux passing portion Q in material 1 to be measured, the length thereof is l3, the cross-section area is S3, and the permeability is μ3, respectively.

Then, first, since magnetic resistance R of a magnetic circuit is a sum of the partial magnetic resistance of each portion, it is possible to express as follows:

$$R = l1/(\mu1 \cdot S1) + l2/(\mu2 \cdot S2) + l3/(\mu3 \cdot S3)$$ Equation (3)

In the above equation (3), as to the magnetic resistance l2/(μ2·S2) of the microscopic area right below the probe needle 21 and the magnetic resistance l3/(μ3·S3) of the other portion Q, the former is overwhelmingly larger, and the former is decisive. Further, by designing to have the magnetic resistance of the probe needle 21 as small as possible, the overall magnetic resistance R is decided only by the magnetic resistance of the small portion P, and thus, highly sensitive detection is obtainable.

Further, let the number of windings in coil 22a of the inductance L as N, the current flowing in coil 22a as i, and the magnetic flux passing through coil 22a as Φ, then, from the relation of N·Φ=L·i, the magnetic resistance R can be expressed as follows:

$$R = N \cdot i / \Phi = N^2 / L \qquad \text{Equation (4)}$$

Therefore, from equation (3) and equation (4), the inductance L is expressed as follows:

$$L = N^2 / (l1/(\mu 1 \cdot S1) + l2/(\mu 2 \cdot S3) + l3/(\mu 3 \cdot S3)) \qquad \text{Equation (5)}$$

Here, to simplify the equations, let the partial resistance $l1/(\mu 1 \cdot S1) + l3/(\mu 3 \cdot S3)$ be replaced by R0, and further, assume that the permeability varies from μ2 to μ2+Δμ2, and the inductance varies from L to L+ΔL, then, $$L + \Delta L = N^2 / [R0 + l2/[(\mu 2 + \Delta \mu 2) \cdot S2)]] \qquad \text{Equation (6)}$$

Thus, the variation of the inductance L caused by the variation of the permeability has been shown.

Because the resonant frequency $f_{LC}$ is expressed as follows;

$$f_{LC} = 1/2\pi \sqrt{(LC)} \qquad \text{Equation (7)}$$

assuming the resonance frequency $f_{LC}$ is varied to $f_{LC} + \Delta f_{LC}$ by the variation of the inductance L from L to L+ΔL, the variation becomes $$f_{LC} + \Delta f_{LC} = 1/2\pi \sqrt{[(L + \Delta L) \cdot C]} \qquad \text{Equation (8)}$$

By applying equation (6) to equation (8), it is possible to obtain the resonant frequency corresponding to a permeability variation in the microscopic area of material 1 to be measured.

Thus, by the permeability measurement apparatus according to the embodiment of the present invention, it is possible to measure permeability in a microscopic area of material 1 to be measured disposed right below probe needle 21. Specifically, in the configuration shown in FIG. 1, as a reference signal, when a frequency signal having n times as large as the frequency ωp of the alternating magnetic field is input to lock-in amplifier 25, permeability of desired order can be measured in separation, corresponding to the reference signal frequency. In particular, by measuring nonlinear (for example, secondary) permeability of the odd-rank tensor, the direction of magnetization can be identified from the sign of the permeability of the odd-rank tensor thereof.

By moving material 1 to be measured relative to probe needle 21, the distribution of nonlinear permeability and the distribution of magnetization can be measured. It may be possible to fix material 1 to be measured, so that probe needle 21 is scannable on the surface of material 1 to be measured, or it may be possible to fix probe needle 21 and move material 1 to be measured relatively to probe needle 21 in the horizontal plane by making magnetic field generator 10, having the mounted material 1 to be measured, function as an XY stage which is movable in a horizontal plane. Namely, the permeability measurement apparatus according to the embodiment of the present invention realizes a scanning nonlinear magnetic microscope (SNMM).

Figure 4A:
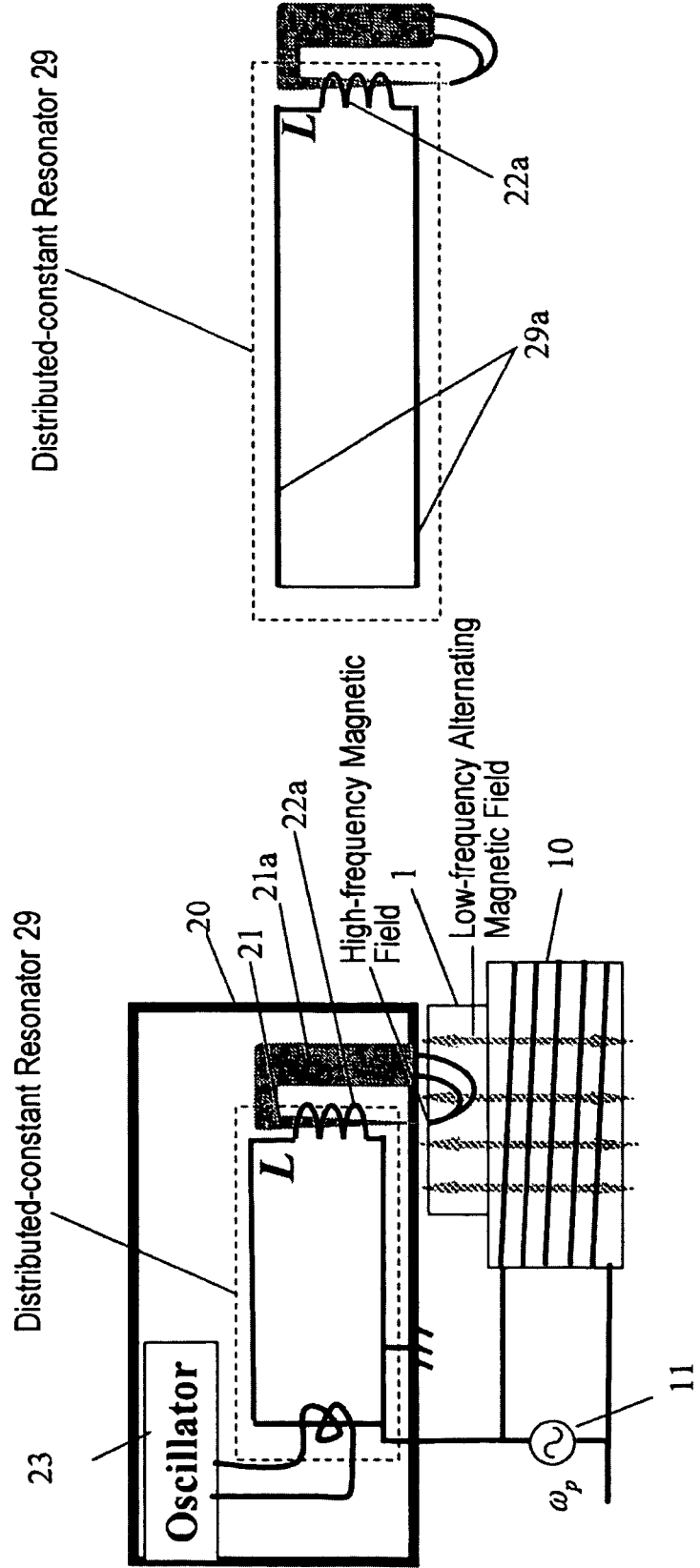
FIG. 4 shows a diagram illustrating another exemplary configuration of a permeability measurement apparatus according to an embodiment of the present invention.
Figure 4B:
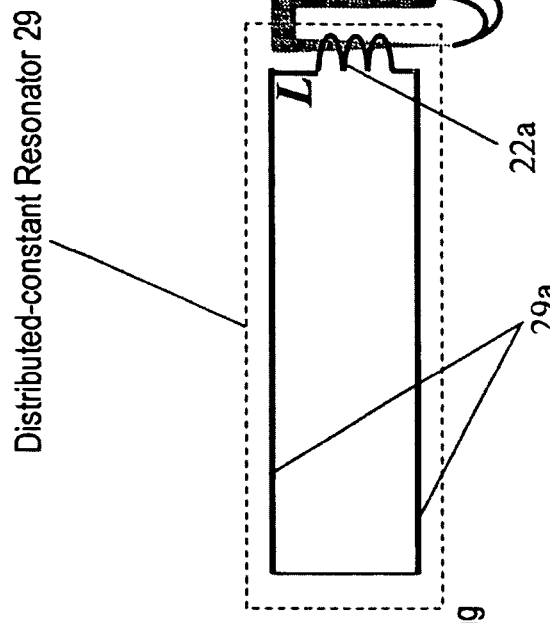

FIG. 4 shows a diagram illustrating another exemplary configuration of a permeability measurement apparatus according to an embodiment of the present invention. As compared with the configuration shown in FIG. 1, the permeability measurement apparatus shown in FIG. 4 includes a distributed-constant resonator 29, in place of LC resonant circuit 22. FIG. 4(a) shows a diagram illustrating the periphery of probe 20, using distributed-constant resonator 29. Although not shown in the figure, there are provided FM demodulation circuit 24 and lock-in amplifier 25, similar to the configuration shown in FIG. 1. Also, FIG. 4(b) shows an equivalent circuit to distributed-constant resonator 29. Distributed-constant resonator 29 is formed of two transmission lines 29a disposed substantially in parallel (including coaxial line) of which each one end is short-circuited and each of the other end is connected via coil 22a being wound on probe needle 21. Similar to LC resonant circuit 22, when the inductance L of coil 22a is varied by a variation of permeability of the material to be measured, the resonant frequency of distributed-constant resonator 29 is varied, and from a frequency variation thereof, the permeability can be measured. Although there are a variety of types of distributed-constant resonators 29, such as a coaxial resonator, any types may be applicable to the present invention. Further, it may also be possible to use other electronic resonators than the LC resonant circuit and the distributed-constant resonator.

FIG. 5 shows a diagram illustrating an embodiment of measuring a magnetic domain, in which an outer view (a) and a measurement result (b) of the material to be measured are shown. As shown in FIG. 5(a), the material to be measured is a periodically polarization-reversed ferromagnetic substance having a magnetic domain pitch of approximately 1 mm. By scanning probe 20 so as to intersect the magnetic domain, and measuring an output signal (ωp component) corresponding to a variation of secondary nonlinear permeability on a step-by-step basis of 100 μm, an output corresponding to the reverse of magnetic polarization can be obtained, and thus, it has been confirmed that the distribution measurement of magnetic polarization of the ferromagnetic substance is possible.

Figure 6B:
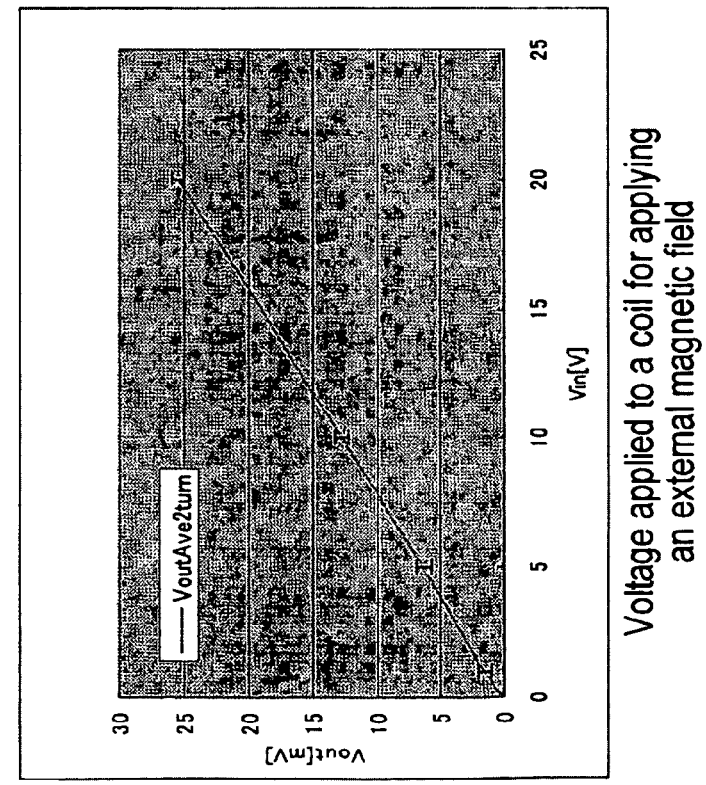
FIG. 6 shows a diagram illustrating a measurement result of the relationship between the intensity of an alternating magnetic field and the intensity of an output signal corresponding to a variation of nonlinear permeability.
Figure 6A:
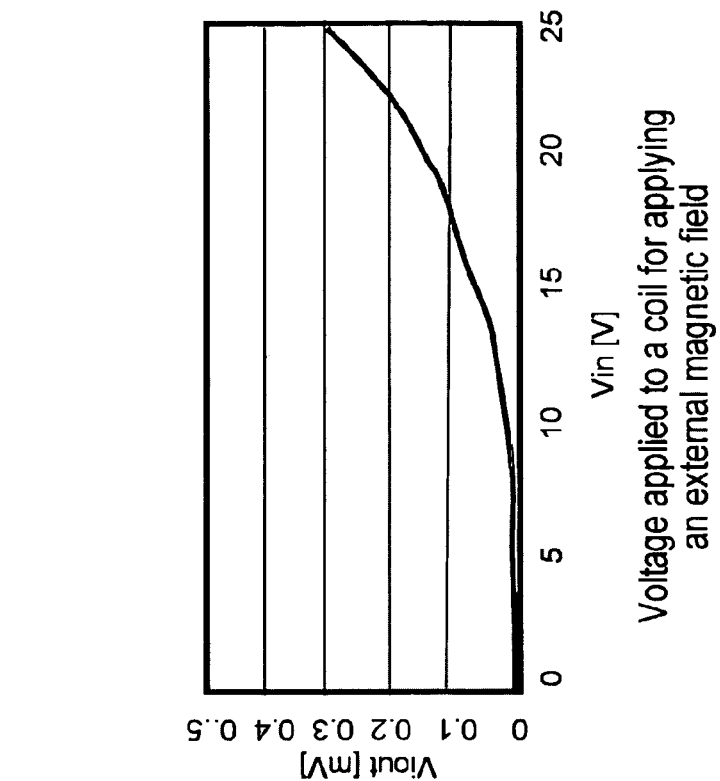

FIG. 6 shows a diagram illustrating a measurement result of the relationship between the intensity of an alternating magnetic field and the intensity of an output signal corresponding to a variation of nonlinear permeability. The voltage in the horizontal axis is a voltage applied to the coil of magnetic field generator 10 for generating an alternating magnetic field, and the above voltage is in proportion to the generated magnetic field intensity. FIG. 6(a) shows the intensity of the output signal (ωp component) of the secondary nonlinear permeability, varied with an identical frequency ωp to the applied alternating magnetic field. It can be understood that the above output intensity is in proportion to the intensity of the applied alternating magnetic field, as is derived from equation (2). FIG. 6(b) is the intensity of the output signal (2ωp component) of third-order nonlinear permeability varying with a frequency 2ωp, twice as high as the frequency of the applied alternating magnetic field. Understandably, the output signal intensity is in proportion to the square of the intensity of the applied alternating magnetic field, as is derived from equation (2).

In the above description, the measurement of nonlinear permeability using the configuration shown in FIG. 1 has been explained as the typical example. However, using the permeability measurement apparatus according to the embodiment of the present invention, it is also possible to measure linear permeability. Specifically, in the configuration shown in FIG. 1, instead of inputting a voltage signal from FM demodulator 24 into lock-in amplifier 25, the direct current component thereof is directly detected by a voltmeter (not shown), and a variation of the center frequency of an oscillation frequency (or resonant frequency) is measured. Thus, linear (primary) permeability can be detected.

In regard to the linear permeability, by moving material 1 to be measured relative to probe needle 21, it is possible to measure the distribution of the linear permeability of material 1 to be measured.

Further, the permeability measurement apparatus according to the embodiment of the present invention can measure the distribution of magnetic field of the material to be measured. In the case of permeability measurement according to the aforementioned principle, a low-frequency alternating magnetic field is applied externally to the material to be measured, and a variation of the permeability of the material to be measured according to the variation of the applied magnetic field is measured. Accordingly, it is preferable that the characteristic of probe needle 21 includes high permeability, and that the permeability of the probe needle itself varies as small as possible to the variation of the externally applied magnetic field and to the static magnetic field of the material itself to be measured (i.e. a ferromagnetic substance of a large coercive magnetic field or para magnetic substance of an integrally linear characteristic). The reason is that, if the permeability variation of probe needle 21 itself to the externally applied magnetic field is relatively large, it becomes impossible to distinguish whether the measured permeability relates to the material to be measured or probe needle 21.

On the other hand, in case of measuring magnetic field distribution, because it is necessary to respond with high sensitivity to the static magnetic field emitted from the material itself to be measured, as the characteristic of probe needle 21, soft magnetism having a large change rate to a magnetic field variation is preferred. Further, as described later, when it is intended to measure a direction of the magnetic field from the material to be measured also, a substance having nonlinear permeability of the odd-rank tensor (for example, secondary nonlinear permeability), such as a ferromagnetic substance, is preferable. When only the magnetic field intensity is to be observed, probe needle 21 may sufficiently be formed of a material such as a para magnetic substance not having nonlinear permeability of the odd-rank tensor.

By applying probe needle 21 having nonlinear permeability of the odd-rank tensor (secondary, for example), it is possible to measure the magnetic polarization distribution of the material to be measured, as described in the above explanation of permeability measurement. In the above case, as in the case of the permeability measurement of material 1 to be measured, instead of detecting the sign of the nonlinear permeability of the material itself to be measured, which is reversed depending on the direction of magnetization of material 1 to be measured, by detecting the sign of the nonlinear permeability of probe needle 21, which is reversed depending on the direction of the magnetic field from the material to be measured, the magnetic polarization distribution of the material to be measured is measured.

FIG. 7 shows a diagram illustrating an exemplary configuration for measuring a magnetic field distribution of a permeability measurement apparatus according to the present embodiment. Although the configuration in the figure is shown in a simplified manner, the detection system includes FM demodulation circuit 24 and a synchronous detector such as lock-in amplifier 25, similar to the configuration shown in FIG. 1. It may be possible to use the configuration shown in FIG. 4, needless to say. Here, when only the magnetic field intensity is to be measured, it is sufficient if the voltage signal from FM demodulation circuit 24 is monitored, without need of synchronous detection using lock-in amplifier 25. When the magnetic field is to be observed, the magnetic field can be measured by applying an alternating magnetic field by use of magnetic field generator 10, and by extracting a nonlinear permeability component, having a sign indicative of the direction of magnetic polarization of the probe needle 21, using lock-in amplifier 25. In the above case, by using a ferromagnetic substance, having a small coercive magnetic field and large secondary nonlinear permeability, as probe needle 21, probe needle 21 itself is magnetized by the direct-current magnetic field from the material to be measured. Then, the direction and the magnitude thereof can be measured indirectly from the measurement of the nonlinear permeability of the probe needle 21. Namely, it is the same measurement as in the aforementioned mode for measuring the nonlinear permeability of the material to be measured, if probe needle 21 is regarded as a material to be measured (in the above case, by disposing the material to be measured from the probe needle at a small distance, the nonlinear permeability of the material to be measured is not detected).

Further, the permeability measurement apparatus according to the embodiment of the present invention is also applicable to the measurement of electron spin resonance (ESR).

The electron spin resonance (ESR), which is also called electron para magnetic resonance (EPR), is one of magnetic spectroscopy based on the same principle as nuclear magnetic resonance (NMR). With the absorption spectroscopy using an unpaired electron of a para magnetic substance, information on the electron state and the environment of the electron placed therein is given. The electron includes a magnetic moment caused by a proper spin angular momentum. In a static magnetic field, corresponding to the spin state, an energy level is split into two by Zeeman splitting, and an energy difference is produced between the two levels. Occurrence of magnetic dipole transition between two electron spin levels through resonance absorption of a microwave having energy equal to the above energy difference is termed electron spin resonance. By observing the electron spin resonance, it is possible to identify presence/absence of the unpaired electron and the quantification thereof, and also, to observe the unpaired electron position in the molecule and the surrounding state thereof. Further, it is possible to clarify a reaction speed and a reaction mechanism from the temporal variation of absorption.

The frequency of a high-frequency magnetic field [a small magnetic field applied from probe 20 (probe needle 21) to the material 1 to be measured] for use in the permeability measurement apparatus according to the embodiment of the present invention, is 1 GHz-10 GHz or of that order in the microwave band, which is an equivalent frequency band to the energy absorbed by the electron spin resonance. Therefore, it is possible to apply to the measurement of the electron spin resonance of the material 1 to be measured.

Figure 8:
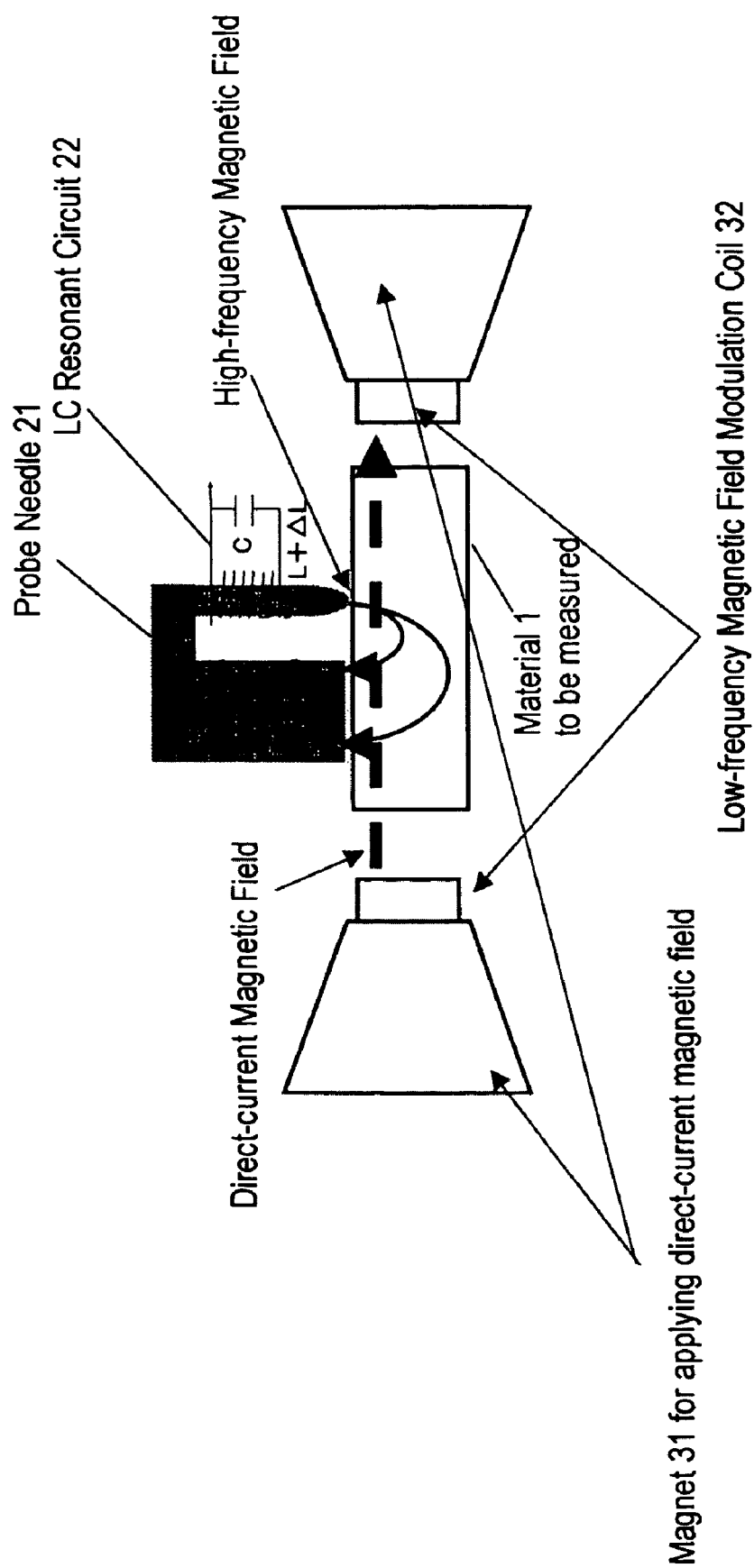
FIG. 8 shows a diagram illustrating an exemplary configuration of a permeability measurement apparatus for measuring electron spin resonance, according to the present embodiment.

FIG. 8 shows a diagram illustrating an exemplary configuration of a permeability measurement apparatus for measuring electron spin resonance, according to the present embodiment. In the configuration shown in FIG. 8, although the figure is shown in a simplified manner only by illustrating material 1 to be measured and the periphery of probe 20, the configuration includes a detection system having oscillator 23 for FM-modulating the resonant frequency of LC resonant circuit 22 of probe 20, FM demodulation circuit 24, and lock-in amplifier 25. It may also be possible to use the configuration shown in FIG. 4, needless to say.

As a characteristic configuration, as shown in the figure, a magnet 31 for applying a direct-current magnetic field, capable of sweeping magnetic field intensity, and a low-frequency magnetic field modulation coil 32 are disposed on both sides of the material 1 to be measured, so as to apply, to material 1 to be measured, a magnetic field having a low-frequency alternating magnetic field with a direct-current magnetic field superposed thereon. Then, by supplying from probe needle 21a high-frequency magnetic field onto material 1 to be measured, the intensity of the direct-current magnetic field is varied (swept).

On the occurrence of the electron spin resonance in a microscopic area right below probe needle 21 with certain magnetic field intensity, the direction of magnetization in the area concerned is varied (rotated) by the high-frequency magnetic field applied perpendicular to the direct-current magnetic field. Theoretically, the variation of the magnetization produces variations of the real part and the imaginary part of magnetic susceptibility $\chi$. The real part of the magnetic susceptibility $\chi$ can be detected virtually as a variation of permeability, through a variation of the inductance L of coil 22a, and accordingly, a variation of the oscillation signal frequency. Also, the imaginary part of the magnetic susceptibility corresponds to a loss caused by energy absorption, and can be detected as a variation of oscillation signal amplitude (level decrease). When an amplitude variation is to be detected, in place of frequency modulation/demodulation in the configuration shown in FIG. 1, an oscillator and a demodulator for amplitude modulation/demodulation are configured (for the details of the variation of magnetization in electron spin resonance, for example, refer to "Denshi spin kyomei (Electron spin resonance)" by Date, Muneyuki; Baifukan; First edition published in 1978, p. 28)

When a frequency variation is to be detected, by superposing a low-frequency alternating magnetic field from the modulation coil onto a direct-current applied magnetic field, since the resonance absorption phenomenon synchronously varies with an alternating magnetic field, highly sensitive detection can be made by use of lock-in amplifier 25.

In the above each embodiments, although the description is based on the measurement by placing probe needle 21 in contact with material 1 to be measured, measurement without contact is also possible. Here, because it is necessary to make a high-frequency magnetic field from probe needle 21 penetrate into material 1 to be measured, to a degree sufficient for permeability measurement, the narrower the gap between the tip of probe needle 21 and material 1 to be measured is, the higher measurement sensitivity becomes possible. Therefore, in the present embodiment, there is proposed a method for controlling the distance between probe needle 21 and material 1 to be measured, using the measurement sensitivity of higher-order permeability.

Figure 9:
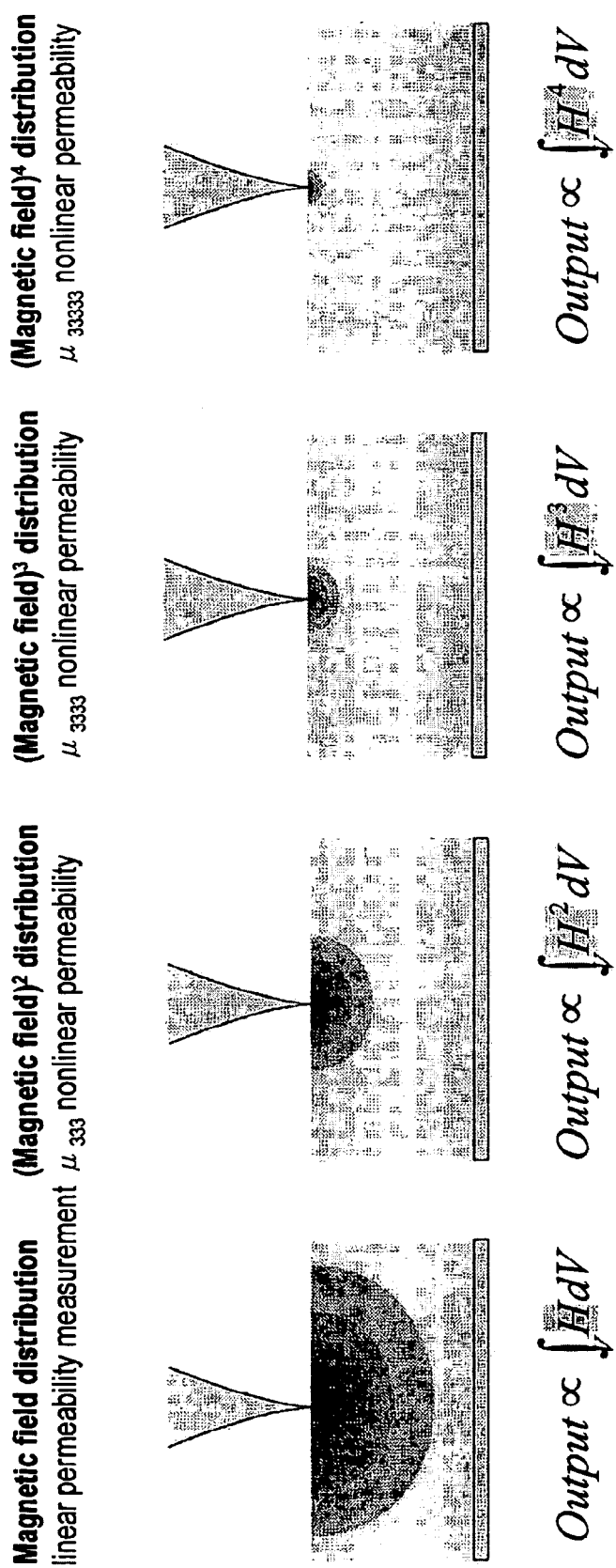
FIG. 9 shows a diagram illustrating the distribution of a magnetic field right below a probe needle 21.

FIG. 9 shows a diagram illustrating the distribution of a magnetic field right below a probe needle 21. As is apparent from FIG. 9, as the order in the power of the magnetic field becomes increased, the area that the magnetic field reaches becomes narrow, and a degree of concentration is increased. The higher concentration signifies that permeability variation in only the portion concerned is detected. Accordingly, if the gap between probe needle 21 and material 1 to be measured is the same, observation with higher resolution can be attained. In other words, the degree of concentration is increased as the order of the magnetic field becomes higher. Therefore, in order to obtain sensitivity necessary for measuring higher-order permeability, it is necessary for a higher-order magnetic field in such a manner as to dispose probe needle 21 in more proximity to material 1 to be measured. Also, if the gap is set sufficiently small to measure the higher-order permeability, naturally, the permeability of lower order than the above high order can be measured with high sensitivity.

Accordingly, using the measurement sensitivity of higher-order permeability as a gap control signal, it is possible to perform non-contact permeability measurement of lower order than the above order. For example, while controlling the gap between probe needle 21 and material 1 to be measured so that the measurement sensitivity of third-order nonlinear permeability is maintained to a certain level, secondary nonlinear permeability is measured. By this, it is possible to control the height of probe needle 21 so that the gap between probe needle 21 and material 1 to be measured is maintained to a substantially constant level, and thus, it is possible to perform non-contact measurement with secured sensitivity necessary for measuring secondary nonlinear permeability, while suppressing dispersion in the measurement sensitivity.

Further, according to the above-mentioned embodiment, there has been exemplified a case that the low-frequency alternating magnetic field to be applied from magnetic field generator 10 to material 1 to be measured is applied in the perpendicular direction (Z direction) of material 1 to be measured. In this case, in principle, it is possible to measure a variation of permeability in the perpendicular direction of material 1 to be measured and the direction of magnetization, which however requires that the desired measurement direction of material 1 to be measured be disposed in the perpendicular direction. To say the other way around, in order to detect, for example, $\mu_{311}$ component of nonlinear permeability to measure the direction of magnetization in the horizontal direction (XY plane) of material 1 to be measured, it is sufficient if a magnetic field is applied in the horizontal direction to material 1 to be measured.

In the simplest case, when the three dimension consisting of X, Y and Z axes is considered, it is possible to measure permeability of a desired direction and the direction of magnetization by providing magnetic field generators for generating magnetic fields in X-direction, Y-direction and Z-direction, respectively, with a mutually different angular frequency for each direction, and by performing synchronous detection using a lock-in amplifier. In the above example, although three-dimension is considered, it is only possible to measure in the fixed directions, namely X-direction, Y-direction and Z-direction. Alternatively, when the XY plane (horizontal plane) is considered, by varying a ratio between the magnetic field intensity in the X direction and the magnetic field intensity in the Y direction, it is possible to apply a magnetic field in an arbitrary direction within the horizontal plane. For example, by applying a magnetic field having H cos $\alpha$ in the X direction and H sin $\alpha$ in the Y direction, it is possible to apply a magnetic field in an angle direction a of the XY plane. Or alternatively, as a further improvement, by applying a rotating magnetic field to a certain plane (for example, the horizontal plane i.e. the XY plane) instead of deciding the direction by adjusting the magnetic field intensity, it is possible to measure permeability and the direction of magnetization in the entire angle directions of a plane.

Figure 10:
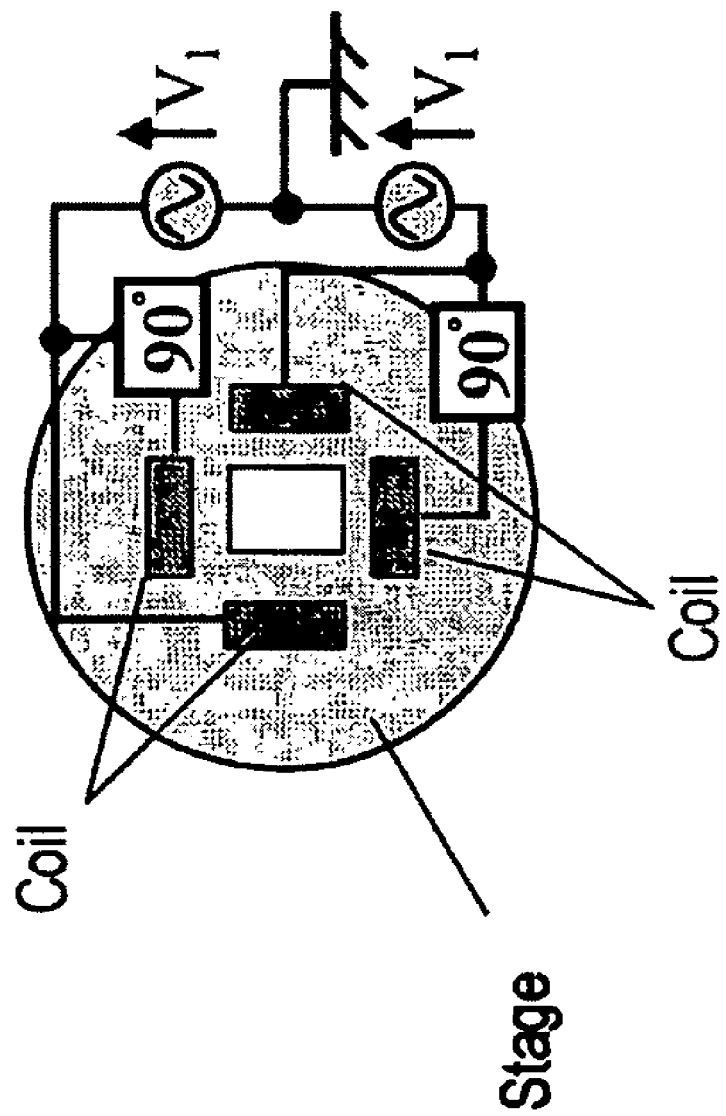
FIG. 10 shows a diagram illustrating an exemplary configuration in principle, for applying rotating magnetic field on a horizontal plane.

FIG. 10 shows a diagram illustrating an exemplary configuration in principle, for applying rotating magnetic field on a horizontal plane. FIG. 10 is a diagram in which a stage, having a material 1 to be measured mounted thereon, is looked from above. As shown in the figure, two pairs of magnetic field generators for applying alternating magnetic fields to material 1 to be measured in the horizontal direction are disposed to be orthogonal to each other, and by applying alternating magnetic fields with each phase shifted by 90 degrees, a rotating magnetic field can be obtained. For example, the magnetic field in the X direction Hx=H cos $\omega$p and the magnetic field in the Y direction Ey=H sin $\omega$p. A variation of the inductance L when the rotating magnetic field is applied, that is, a variation of permeability is varied periodically with an angular frequency ωt. By performing synchronous detection by the lock-in amplifier, using the angular frequency ωt as a reference signal, information of phase difference (angle) in the lock-in amplifier directly represents the direction of magnetization. Accordingly, by obtaining the phase difference from the output of lock-in amplifier 25 during scanning probe 20, it is possible to measure a two-dimensional distribution of the direction of magnetization in the horizontal plane.

Further, by applying a rotating magnetic field which rotates in the horizontal plane (XY plane) and a rotating magnetic field which rotates in the vertical direction (ZX plane or YZ plane), each having a different angular frequency, and by performing synchronous detection by each lock-in amplifier, so as to obtain each phase information (angle), it is also possible to measure a three-dimensional distribution of magnetic polarization.

Figure 11:
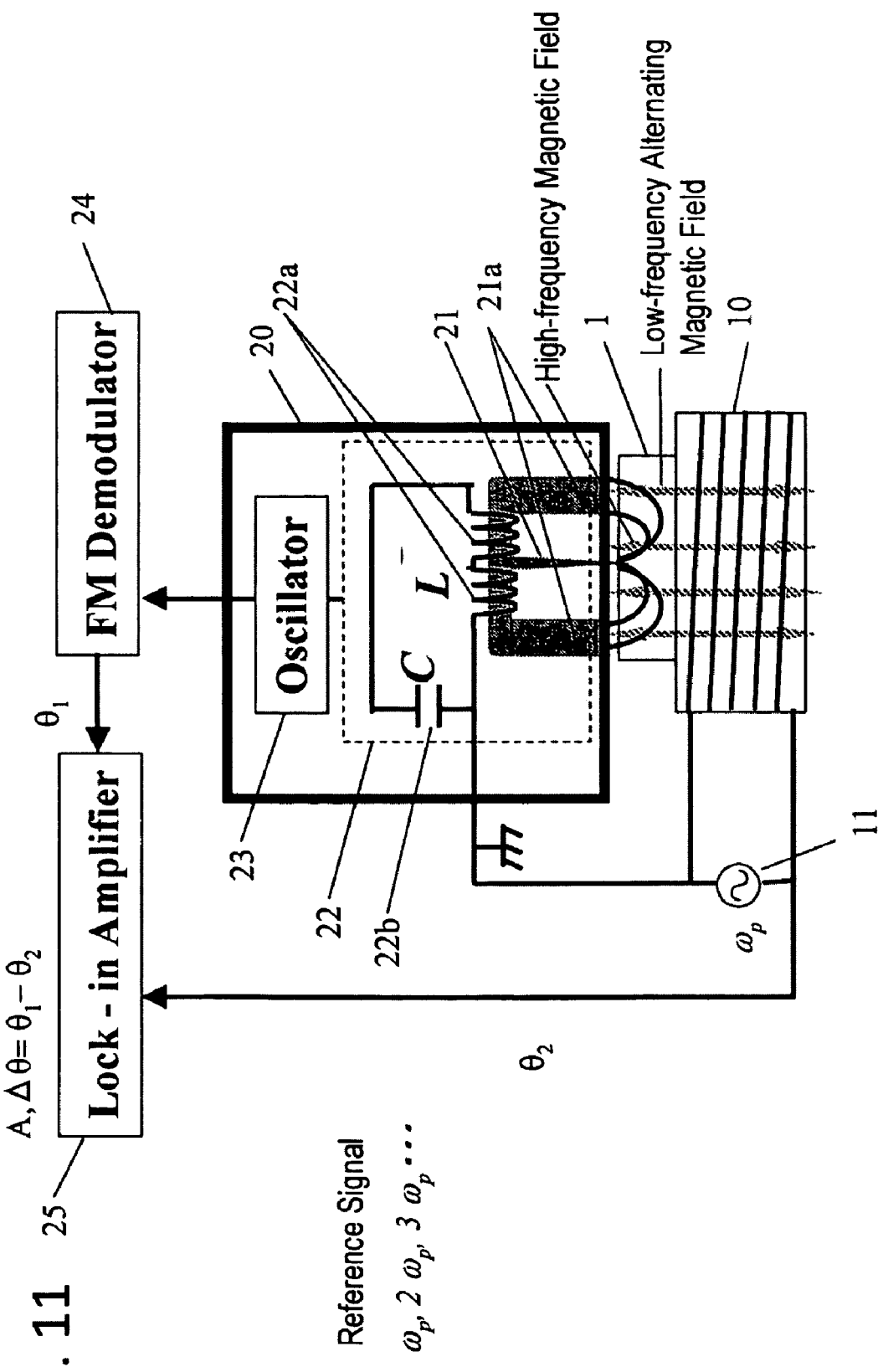
FIG. 11 shows a diagram illustrating an example of deformation of the permeability measurement apparatus configuration shown in FIG. 1.

FIG. 11 shows a diagram illustrating an example of deformation of the permeability measurement apparatus configuration shown in FIG. 1. In the configuration shown in FIG. 11, probe needle 21 includes two extension portions 21a (which are also referred to as returns) extending to both sides from the sharp tip portion thereof. Each extension portion 21a is disposed in a symmetrical position to the sharp tip portion. Coil 22a to be wound on probe needle 21 is wound on both sides and connected in series, as shown in the figure. Also, the directions of windings when the coil is connected in series are mutually opposite so that a high-frequency magnetic field is generated in mutually opposite directions and directed to probe needle 21. By disposing extension portions 21a symmetrically on both sides to the sharp tip portion, measurement with higher sensitivity can be achieved because the high-frequency magnetic field is concentrated at probe needle 21.

The inventors have tried to measure the magnetization of a floppy disk using the permeability measurement apparatus having the configuration shown in FIG. 11. First, the intensity distribution of a magnetic field generated from the floppy disk was measured by use of an MFM (magnetic force microscope), and thereafter, the same sample (for measuring a portion having substantially similar positional relation, though the place was slightly different) was measured by use of the permeability measurement apparatus according to the present invention having the configuration shown in FIG. 11. At that time, probe needle 21 having a tip radius of approximately 80 nm at the sharp tip portion was used.

Figure 12:
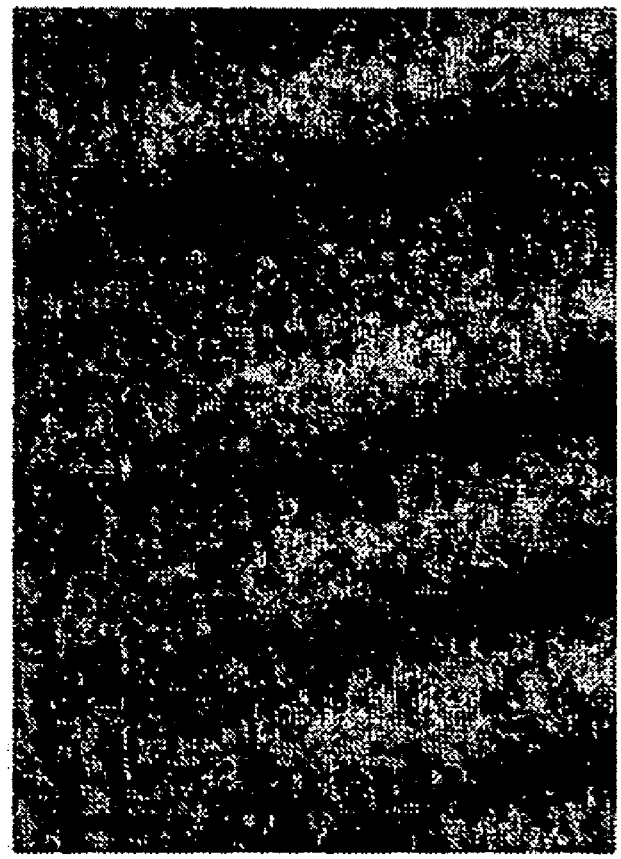
FIG. 12 shows an intensity distribution image of a magnetic field generated from a floppy disk (registered trademark) measured by a magnetic force microscope.

FIG. 12 shows an intensity distribution image of a magnetic field generated from the floppy disk measured by the magnetic force microscope. The measurement position is a recording track end of the floppy disk. It can be understood that magnetic recording has been made, as well as a magnetization distribution state at the track end (the magnetic field generated from the magnetization of the floppy disk is measured using the magnetic force microscope, and the image corresponding to the magnetization can be obtained, which is however indirect and as the present apparatus, it is not that the magnetization itself is measured).

Figure 13A:
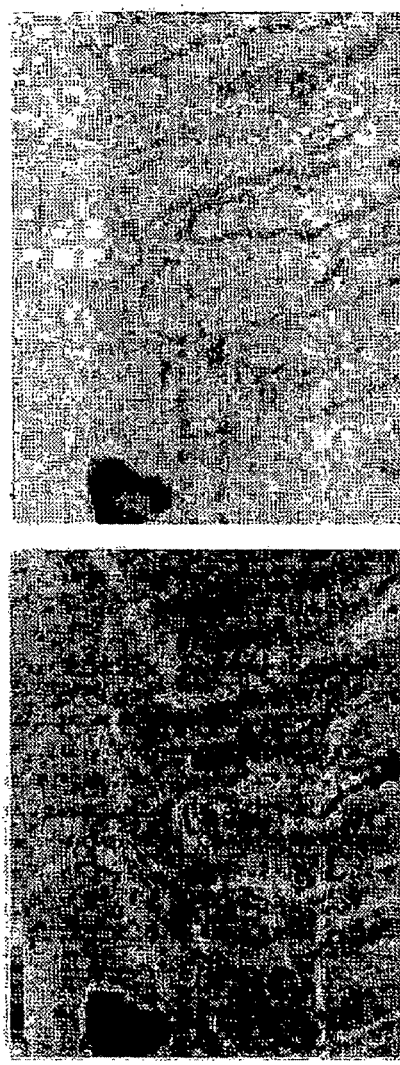
FIG. 13 shows a magnetization distribution image measured by the permeability measurement apparatus having the configuration shown in FIG. 11.
Figure 13B:
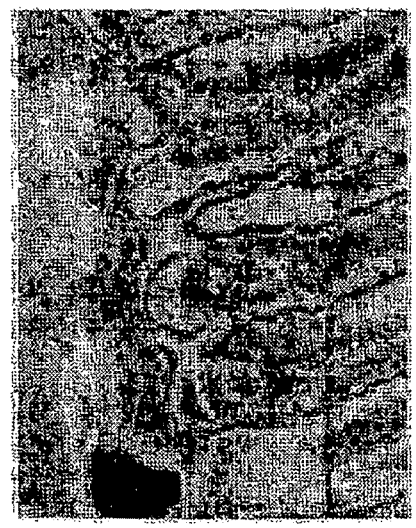
Figure 13C:

FIG. 13 shows a magnetization distribution image measured by the permeability measurement apparatus having the configuration shown in FIG. 11. FIG. 13(*a*) is a phase image (cos θ), FIG. 13(*b*) is an amplitude image (A), and FIG. 13(*c*) is an A cos θ image. As shown in the figure, in the measurement using the permeability measurement apparatus according to the present invention, it is definitely understood that images corresponding to the magnetization distribution of the floppy disk are obtained clearly. As is apparent from the comparison with FIG. 12, the resolution is higher as compared with the magnetic force microscope. From this, it has become clear that the permeability measurement apparatus according to the present invention is a powerful tool for measuring the magnetization distribution in a magnetic material with high resolution.

INDUSTRIAL APPLICABILITY

The permeability measurement apparatus according to the present invention is applicable to the evaluation of a magnetic substance such as bit observation in microtechnical vertical magnetic recording, and the measurement in nanospintronics.

What is claimed is:

1. A permeability measurement apparatus comprising:
    a magnetic field generation means applying an alternating magnetic field having a predetermined frequency to a magnetic substance to be measured;
    a probe needle placed in proximity or in contact to a microscopic area of the magnetic substance to be measured to which the alternating magnetic field is applied;
    a resonator including a coil wound on the probe needle, and generating a magnetic field having a resonant frequency higher than the frequency of the alternating magnetic field applied on the microscopic area having the probe needle in proximity or in contact thereto, and having inductance of the coil varied as permeability in the microscopic area varies; and
    a measurement means measuring the permeability of the microscopic area of the magnetic substance to be measured based on the variation of the resonant frequency of the resonator according to the variation of the coil inductance.

2. The permeability measurement apparatus according to claim 1,
    wherein the measurement means includes:
    an oscillation means outputting an oscillation signal having a frequency according to the variation of the resonant frequency;
    a demodulation means outputting a voltage signal demodulated from the oscillation signal; and
    a detection means detecting linear permeability from a direct current component of the voltage signal.

3. The permeability measurement apparatus according to claim 1,
    wherein the measurement means includes:
    an oscillation means outputting an oscillation signal having a frequency according to the variation of the resonant frequency;
    a demodulation means outputting a voltage signal demodulated from the oscillation signal; and
    a detection means detecting nonlinear permeability from an alternating current component of the voltage signal.

4. The permeability measurement apparatus according to claim 3,
    wherein the detection means measures lowest-order nonlinear permeability from a predetermined frequency component of the alternating magnetic field among the alternating current component of the voltage signal, and measures higher-order nonlinear permeability than the lowest order based on a frequency component of integer multiple of two or more of the predetermined frequency of the alternating magnetic field.

5. The permeability measurement apparatus according to claim 4,
    wherein the detection means measures a direction of magnetization in the microscopic area, based on a sign of nonlinear permeability in an odd-rank tensor including the lowest-order nonlinear permeability.

6. The permeability measurement apparatus according to claim 4, further comprising:

a scanning means moving the probe needle relatively to the magnetic substance to be measured; and a gap control means performing non-contact control so that a gap between the probe needle and the magnetic substance to be measured becomes a certain distance, based on a measurement level of the high-order nonlinear permeability detected by the detection means, wherein the detection means measures nonlinear permeability of lower order than the high-order nonlinear permeability.

7. The permeability measurement apparatus according to claim 4, wherein the magnetic field generation means applies a rotating magnetic field having a magnetic field direction successively rotating in a predetermined plane.

8. The permeability measurement apparatus according to claim 1, wherein the probe needle includes an extension portion being connected to the probe needle and extending substantially in parallel to the probe needle to a position in the proximity of the magnetic substance to be measured.

9. The permeability measurement apparatus according to claim 4, wherein the detection means further measures a magnitude and a direction of the magnetic field in the microscopic area of the magnetic substance to be measured, based on the measured nonlinear permeability.

10. An electron spin resonance apparatus comprising:

a magnetic field generation means applying an alternating magnetic field having a predetermined frequency and a direct-current magnetic field in superposition to a magnetic substance to be measured;

a probe needle placed in proximity or in contact to a microscopic area of the magnetic substance to be measured;

a resonator including a coil wound on the probe needle, and generating a magnetic field having a predetermined resonant frequency applied on the microscopic area having the probe needle in proximity or in contact thereto, and at least having inductance of the coil varied due to electron spin resonance generated in the microscopic area; and a measurement means for measuring electron spin resonance generated in the microscopic area of the magnetic substance to be measured based on the variation of the resonant frequency or the resonant level of the resonator.

* * * * *